United States Patent
Maruyama et al.

(10) Patent No.: US 9,720,334 B2
(45) Date of Patent: Aug. 1, 2017

(54) STAGE APPARATUS, LITHOGRAPHY APPARATUS, METHOD OF MANUFACTURING AN ARTICLE, AND DETERMINATION METHOD

(71) Applicant: CANON KABUSHIKI KAISHA, Tokyo (JP)

(72) Inventors: Satoshi Maruyama, Utsunomiya (JP); Mitsuo Hirata, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/740,705

(22) Filed: Jun. 16, 2015

(65) Prior Publication Data

US 2015/0362846 A1 Dec. 17, 2015

(30) Foreign Application Priority Data

Jun. 17, 2014 (JP) .................. 2014-124684

(51) Int. Cl.
*G03B 27/42* (2006.01)
*G03B 27/58* (2006.01)
(Continued)

(52) U.S. Cl.
CPC ...... *G03F 7/70725* (2013.01); *G03F 7/70758* (2013.01); *G03F 7/70775* (2013.01)

(58) Field of Classification Search
CPC ............ G03F 7/70725; G03F 7/70716; G03F 7/70758; G03F 7/70775; G03F 7/70783; G03F 7/7085; G03F 7/709; G03F 7/70733
(Continued)

(56) References Cited

U.S. PATENT DOCUMENTS 5,666,038 A * 9/1997 Ohishi ................ G03F 7/70716
318/625
2001/0027595 A1* 10/2001 Saiki .................. G03F 7/70716
29/25.01
(Continued)

FOREIGN PATENT DOCUMENTS

CN 1658075 A 8/2005
CN 101855705 A 10/2010
(Continued)

OTHER PUBLICATIONS

Office Action issued in Korean Patent Application No. 10-2015-0083121, mailed Nov. 21, 2016. English translation provided.
(Continued)

*Primary Examiner* — Christina Riddle
(74) *Attorney, Agent, or Firm* — Rossi, Kimms & McDowell LLP

(57) ABSTRACT

The present invention provides a stage apparatus including a stage being movable, comprising a driving unit configured to drive the stage by providing thrust to the stage, a measuring unit configured to measure a position of the stage, and a control unit configured to control the position of the stage by supplying, to the driving unit, a signal composed of a first signal for reducing a deviation between a current position of the stage and a target position, and a second signal for reducing vibration of the stage caused by a thrust ripple included in the thrust.

12 Claims, 11 Drawing Sheets

(51) Int. Cl.
*G03B 27/62* (2006.01)
*G03F 7/20* (2006.01)

(58) Field of Classification Search
USPC .... 355/52, 53, 55, 67–77; 250/492.1, 492.2, 250/492.22, 493.1
See application file for complete search history.

(56) References Cited

U.S. PATENT DOCUMENTS

| | | | |
|---|---|---|---|
| 2006/0076839 A1* | 4/2006 | Kawai | H02K 41/03 310/12.15 |
| 2006/0170888 A1* | 8/2006 | Asano | G03F 7/70725 355/53 |
| 2009/0014932 A1* | 1/2009 | Nikaido | G03F 7/70725 269/55 |
| 2011/0046795 A1 | 2/2011 | Fujimoto et al. | |
| 2011/0177461 A1* | 7/2011 | Shibazaki | G03F 7/70775 430/325 |
| 2013/0329207 A1 | 12/2013 | Endo | |
| 2014/0239855 A1* | 8/2014 | Yen | H02P 25/06 318/135 |

FOREIGN PATENT DOCUMENTS

| | | |
|---|---|---|
| CN | 103488053 A | 1/2014 |
| JP | 2001175332 A | 6/2001 |
| JP | 2003088159 A | 3/2003 |
| KR | 10-2011-0108756 A | 10/2011 |

OTHER PUBLICATIONS

Office Action issued in Chinese Patent Application No. 201510336733.7 mailed Mar. 8, 2017. English translation provided.

* cited by examiner

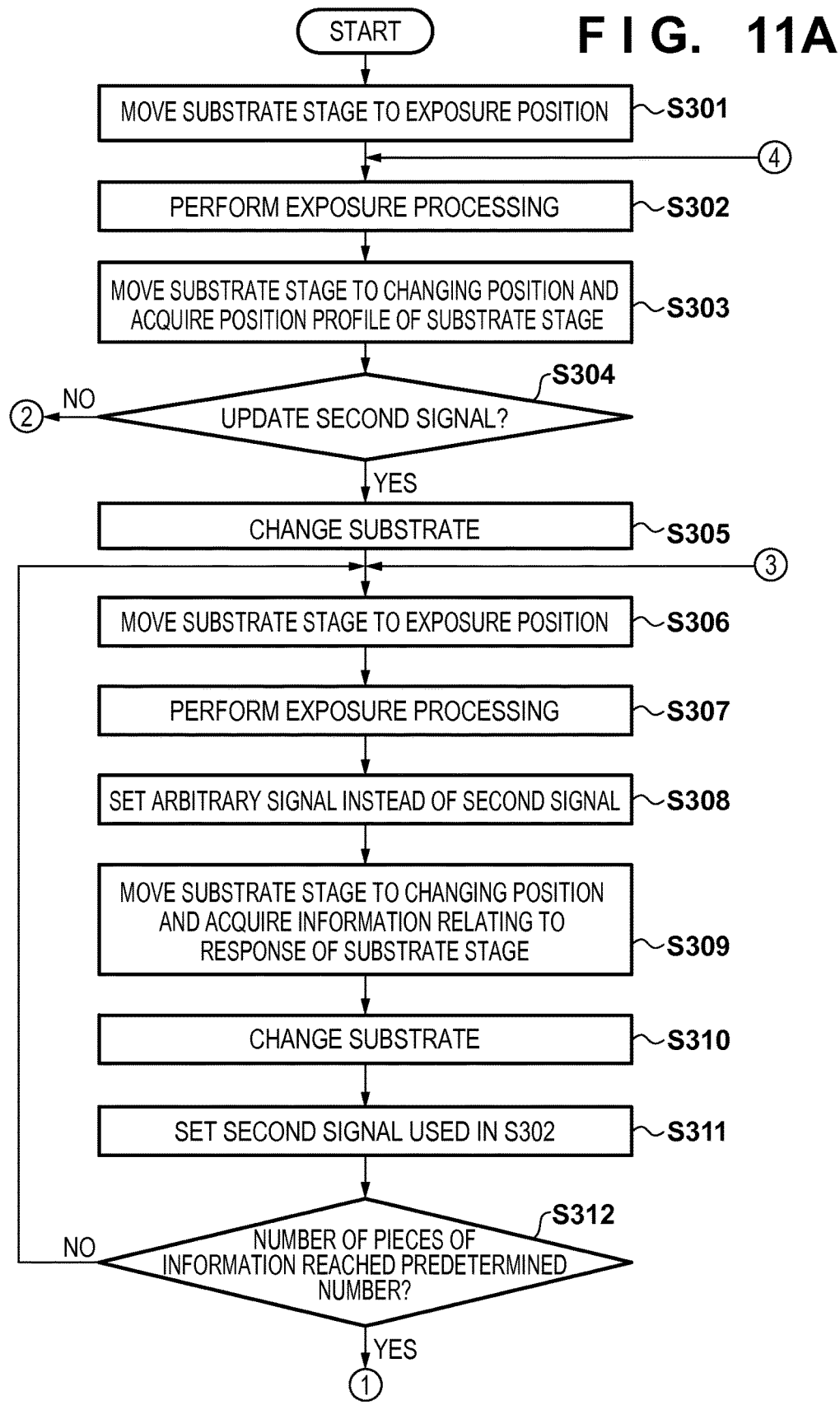

STAGE APPARATUS, LITHOGRAPHY APPARATUS, METHOD OF MANUFACTURING AN ARTICLE, AND DETERMINATION METHOD

BACKGROUND OF THE INVENTION

Field of the Invention

The present invention relates to a stage apparatus, a lithography apparatus, a method of manufacturing an article, and a determination method.

Description of the Related Art

With lithography apparatuses used in manufacturing semiconductor devices and the like, it has been desired that a stage that holds a substrate or a mask is positioned with high accuracy. Generally, in lithography apparatuses, a driving unit that drives a stage by providing thrust to the stage is provided, and the position of the stage is controlled by supplying a signal (first signal) for reducing deviation between the current position and a target position of the stage to the driving unit.

With a lithography apparatus having this kind of configuration, it is known that a ripple (thrust ripple) is included in the thrust supplied by the driving unit to the stage, and the thrust ripple causes the stage to vibrate. Japanese Patent Laid-Open No. 2001-175332 and Japanese Patent Laid-Open No. 2003-88159 propose a method of controlling the position of a stage by supplying a first signal and a signal (second signal) for reducing vibration of the stage that is caused by thrust ripple to the driving unit. Japanese Patent Laid-Open No. 2001-175332 discloses a method of obtaining a thrust ripple based on a model formula using the design data for the driving unit (e.g., a linear motor) and determining the second signal so as to cancel out the obtained thrust ripple. Also, Japanese Patent Laid-Open No. 2003-88159 discloses a method in which the second signal is determined with a focus on the fact that the frequency of the thrust ripple is an integer multiple of the electrical angular frequency of a motor included in the driving unit.

As with the method disclosed in Japanese Patent Laid-Open No. 2001-175332, vibration of the stage caused by the thrust ripple may not be sufficiently reduced if the second signal is determined based only on the thrust ripple obtained based on the model formula using the design data of the driving unit. Also, in Japanese Patent Laid-Open No. 2003-88159, it is not disclosed that the amplitude and phase of the second signal are determined so as to reduce vibration of the stage caused by the thrust ripple.

SUMMARY OF THE INVENTION

The present invention provides a technique that is advantageous for high-accuracy positioning of a stage, for example.

According to one aspect of the present invention, there is provided a stage apparatus including a stage being movable, the apparatus comprising: a driving unit configured to drive the stage by providing thrust to the stage; a measuring unit configured to measure a position of the stage; and a control unit configured to control the position of the stage by supplying, to the driving unit, a signal composed of a first signal for reducing a deviation between a current position of the stage and a target position, and a second signal for reducing vibration of the stage caused by a thrust ripple included in the thrust, wherein the control unit obtains, based on results of measurement performed by the measuring unit, a plurality of pieces of information relating to a response of the stage in a case where a plurality of signals in which at least one of an amplitude and a phase is different are used instead of the second signal, and determines the second signal based on the plurality of pieces of information such that the amplitude of the vibration of the stage caused by the thrust ripple falls within an allowable range.

Further features of the present invention will become apparent from the following description of exemplary embodiments with reference to the attached drawings.

BRIEF DESCRIPTION OF THE DRAWINGS

FIGS. 11A and 11B are flowcharts showing processing in which the exposure apparatus exposes each of multiple substrates to light.

DESCRIPTION OF THE EMBODIMENTS

Figure 1:
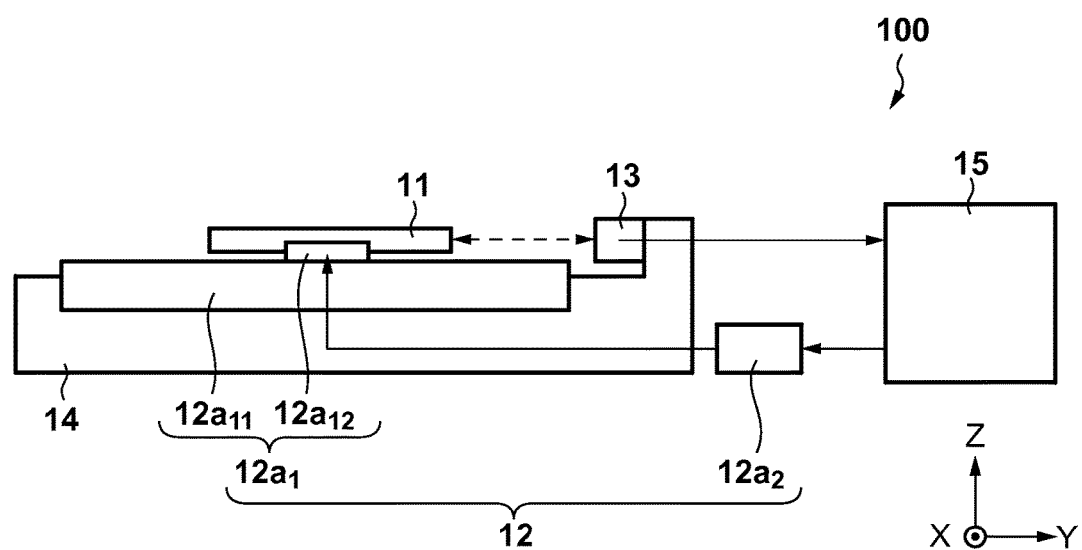
FIG. 1 is a schematic diagram showing a stage apparatus of a first embodiment.

Exemplary embodiments of the present invention will be described below with reference to the accompanying drawings. Note that the same reference numerals denote the same members throughout the drawings, and a repetitive description thereof will not be given.

First Embodiment

A stage apparatus 100 according to a first embodiment of the present invention will be described with reference to FIG. 1. FIG. 1 is a schematic diagram showing the stage apparatus 100 of the first embodiment. The stage apparatus 100 of the first embodiment can include a movable stage 11, a driving unit 12 that drives the stage 11, a measuring unit 13 that measures the position of the stage 11, and a control unit 15. For example, the control unit 15 includes a CPU, memory, or the like, and controls the units of the stage apparatus 100. Here, in the first embodiment, in order to simplify the description, a method for controlling the position of the stage 11 in the Y direction will be described, but the position of the stage 11 can be controlled in the X direction as well using a similar configuration.

The driving unit 12 drives the stage 11 by providing thrust to the stage 11. In the first embodiment, the driving unit 12 can include a linear motor $12a_1$ having a stator $12a_{11}$ and a movable element $12a_{12}$, and a driver $12a_2$ that supplies current to the linear motor $12a_1$ (e.g., the movable element $12a_{12}$) according to a signal supplied from the control unit 15. The stator $12a_{11}$ of the linear motor $12a_1$ is fixed to a base 14, and the movable element $12a_{12}$ is fixed to the stage 11. Also, the driver $12a_2$ can drive the stage 11 in the Y direction by supplying current to the linear motor $12a_1$ according to a signal supplied from the control unit 15. Here, the position of the stage 11 can be measured by the measuring unit 13 provided on the base 14. The measuring unit 13 includes a laser interferometer, for example, which emits a laser beam to a mirror (not shown) provided on a side surface of the stage 11, obtains a displacement from the reference position of the stage 11 using the laser beam reflected by the mirror, and can obtain the current position of the stage 11 based on the displacement. Also, the control unit 15 positions the stage 11 by controlling the driving unit 12 such that the deviation between the current position of the stage 11 measured by the measuring unit 13 and the target position approaches zero.

Figure 2:
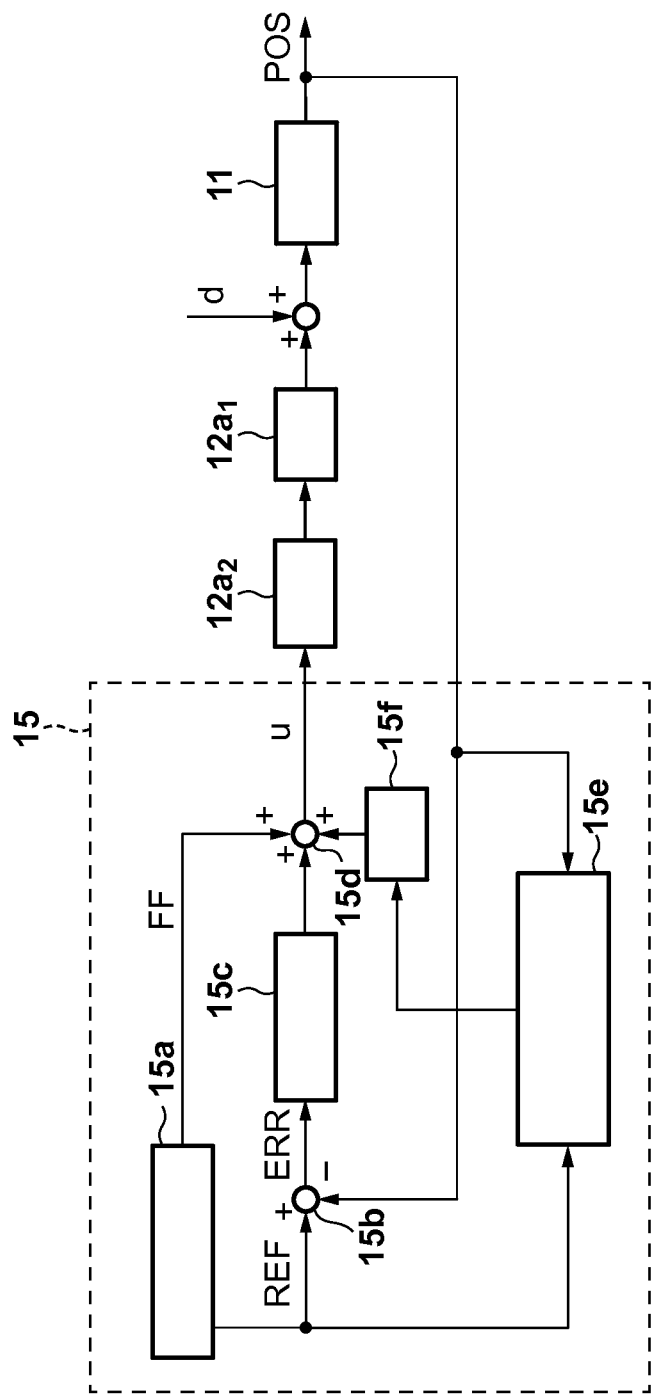
FIG. 2 is a block line diagram showing a control system according to the first embodiment.

FIG. 2 is a block line diagram showing a control system according to the first embodiment. In FIG. 2, the control unit 15 includes a first supply unit 15a, a subtractor 15b, a compensator 15c, an adder 15d, a generator 15e, and a second supply unit 15f. The first supply unit 15a supplies a command value for a target position REF of the stage 11 to the subtractor 15b. Based on the command value supplied from the first supply unit 15a, the subtractor 15b calculates a deviation ERR between the current position POS of the stage 11 measured by the measuring unit 13 and the target position REF. The compensator 15c is a PID compensator, for example, which generates a signal (first signal) for reducing the deviation ERR calculated by the subtractor 15b. The compensator 15c may generate the first signal such that the deviation ERR calculated by the subtractor 15b approaches zero. The first signal generated by the compensator 15c is supplied to the driver $12a_2$ of the driving unit 12. The driver $12a_2$ supplies current to the linear motor $12a_1$ according to the supplied signal. With this kind of control, the stage apparatus 100 can position the stage 11 such that the deviation ERR between the current position POS of the stage 11 and the target position REF approaches zero.

On the other hand, with the thus-configured stage apparatus 100, it is known that a ripple (thrust ripple d) is included in the thrust provided to the stage 11 by the driving unit 12 (linear motor $12a_1$), and therefore the stage 11 vibrates due to the thrust ripple d. For this reason, the control unit 15 of the first embodiment can include a generator 15e that generates a signal (second signal) for reducing vibration of the stage 11 caused by the thrust ripple, and a second supply unit 15f that supplies the second signal generated by the generator 15e to the adder 15d. The second signal generated by the generator 15e is set in the second supply unit 15f and is supplied to the adder 15d by the second supply unit 15f. After being supplied to the adder 15d, the second signal is added to the first signal and supplied to the driver $12a_2$ of the driving unit 12. The driver $12a_2$ of the driving unit 12 supplies current to the linear motor $12a_1$ according to the signal composed of the first signal and the second signal (composite signal u). With this kind of control, the stage apparatus 100 can position the stage 11 such that the deviation ERR between the current position POS of the stage 11 and the target position REF is reduced and the vibration of the stage 11 caused by thrust ripple is reduced. Here, as shown in FIG. 2, the control unit 15 may be configured such that a feed-forward signal FF is supplied from the first supply unit 15a to the adder 15d, and a signal composed of the first signal, second signal, and feed-forward signal FF is supplied to the driver $12a_2$.

Figure 3:
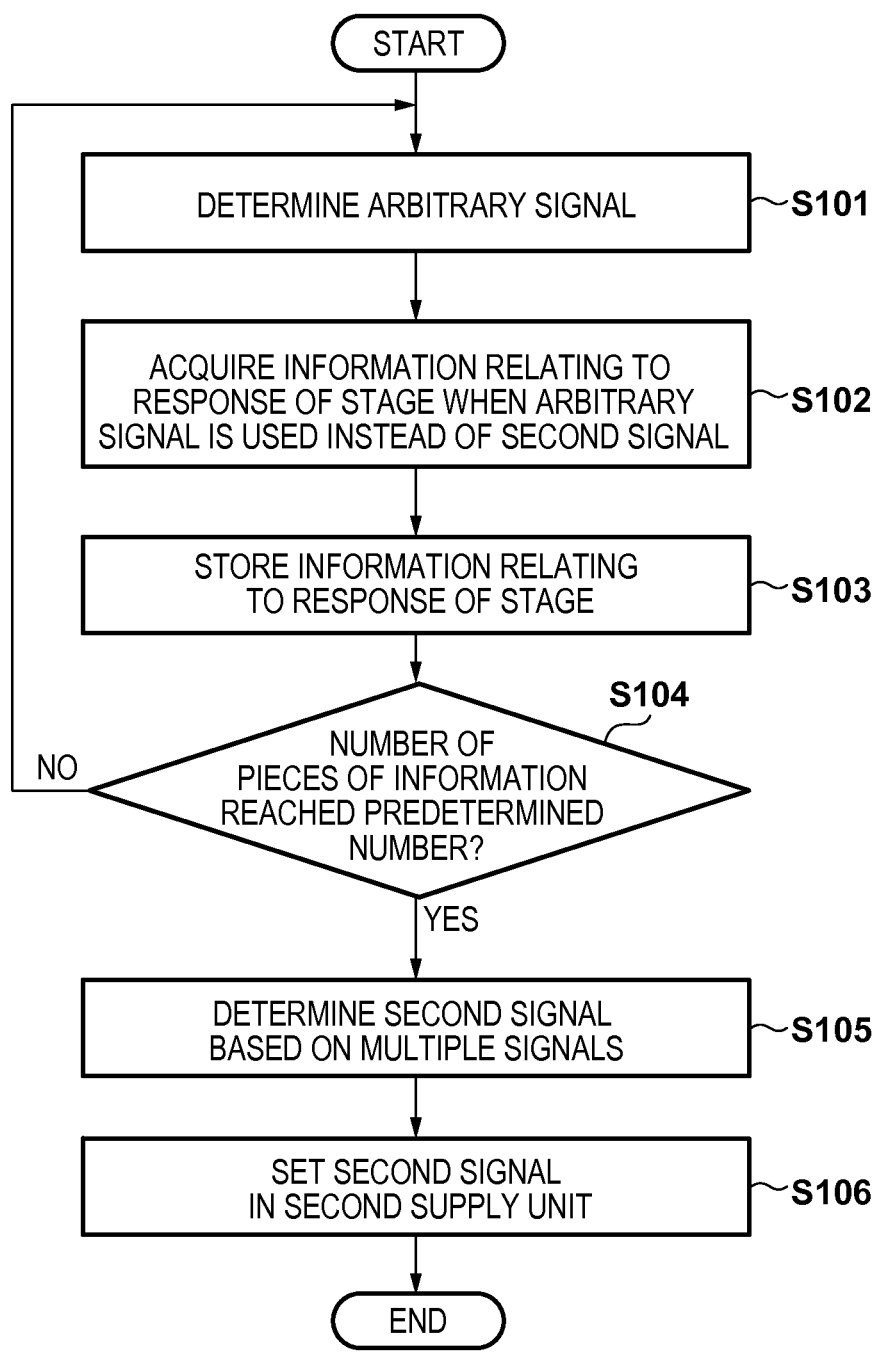
FIG. 3 is a flowchart showing a method for generating a second signal.

Here, a method for generating the second signal in the control unit 15 (generator 15e) will be described with reference to FIG. 3. FIG. 3 is a flowchart showing a method for generating a second signal in the control unit 15. In step S101, the control unit 15 determines an arbitrary signal that is to be supplied to the adder 15d instead of the second signal. A sine wave signal S expressed by equation (1) for example can be used as the second signal. In equation (1), A represents the amplitude, α represents the phase, and θ represents the electrical angle of the linear motor $12a_1$. For this reason, the sine wave signal S expressed by equation (1) can also be used as the arbitrary signal used instead of the second signal. In the first embodiment, the amplitude A and phase α of the arbitrary signal are set as parameters for specifying the waveform. The values of the parameters may be set such that vibration of a factor of around 2 to 5 with respect to the vibration of the stage 11 caused by the thrust ripple is generated. Also, using the addition theorem, equation (1) is expressed as in equation (2). Here, in the first embodiment, both the amplitude A and the phase α of the arbitrary signal are set as the parameters, but it is possible to set at least one of the amplitude A and the phase α as the parameter.

$$S=A \sin(\theta+\alpha) \qquad (1)$$

$$S=A_1 \sin \theta + A_2 \cos \theta$$

$$A_1=A \cos \alpha, A_2=A \sin \alpha \qquad (2)$$

In step S102, the control unit 15 supplies a signal composed of the arbitrary signal determined in step S101 and the first signal to the driving unit 12, thus causing the driving unit 12 to drive the stage 11. As this time, based on the result of measurement performed by the measuring unit 13, the control unit 15 obtains information relating to the response of the stage 11 when the arbitrary signal is used instead of the second signal. The information relating to the response of the stage can include information relating to a position profile indicating positions of the stage 11 with respect to times, for example. In step S103, the control unit 15 stores the information relating to the response of the stage 11 acquired in step S102. Also, the control unit 15 may store a target position profile used when moving the stage 11 in step S102. The target position profile is a profile indicating the target positions REF of the stage 11 with respect to times, and is a data string of command values (target positions REF) output from the first supply unit 15a.

In step S104, the control unit 15 determines whether or not the number of pieces of information acquired in step S102 and stored in step S103 has reached a predetermined number. If the number of pieces of information has reached the predetermined number, the processing moves to step S105. On the other hand, if the number of pieces of information has not reached the predetermined number, the processing moves to step S101, and the control unit 15 changes the values of the parameters of the arbitrary signal (amplitude A and phase α). Also, the control unit 15 newly acquires the information relating to the response of the stage 11 when the arbitrary signal resulting from changing the values of the parameters is used instead of the second signal (step S102), and the control unit 15 stores the newly-acquired information (step S103). In this way, the control unit 15 can acquire multiple pieces of information relating to the position profile of the stage 11 by supplying multiple arbitrary signals with mutually different parameter values to the driving unit 12 instead of the second signal. Here, the number of pieces of information acquired by driving the stage 11 using the arbitrary signal may be larger than the number of types of parameters to be determined in the second signal. For this reason, the control unit 15 may set the predetermined number to a number that is one greater than the number of types of parameters to be determined in the second signal. For example, with the second signal expressed using equation (1), the parameters to be determined are the amplitude A and the phase α, and therefore the number of types of parameters is "2". In this case, the control unit 15 may set the predetermined number to "3".

In step S105, based on the multiple pieces of information acquired by repeating steps S101 to S103, the control unit 15 determines the second signal such that the amplitude of the vibration of the stage 11 caused by the thrust ripple falls within an allowable range. In step S106, the control unit 15 sets the second signal determined in step S105 in the second supply unit 15f.

Figure 4:
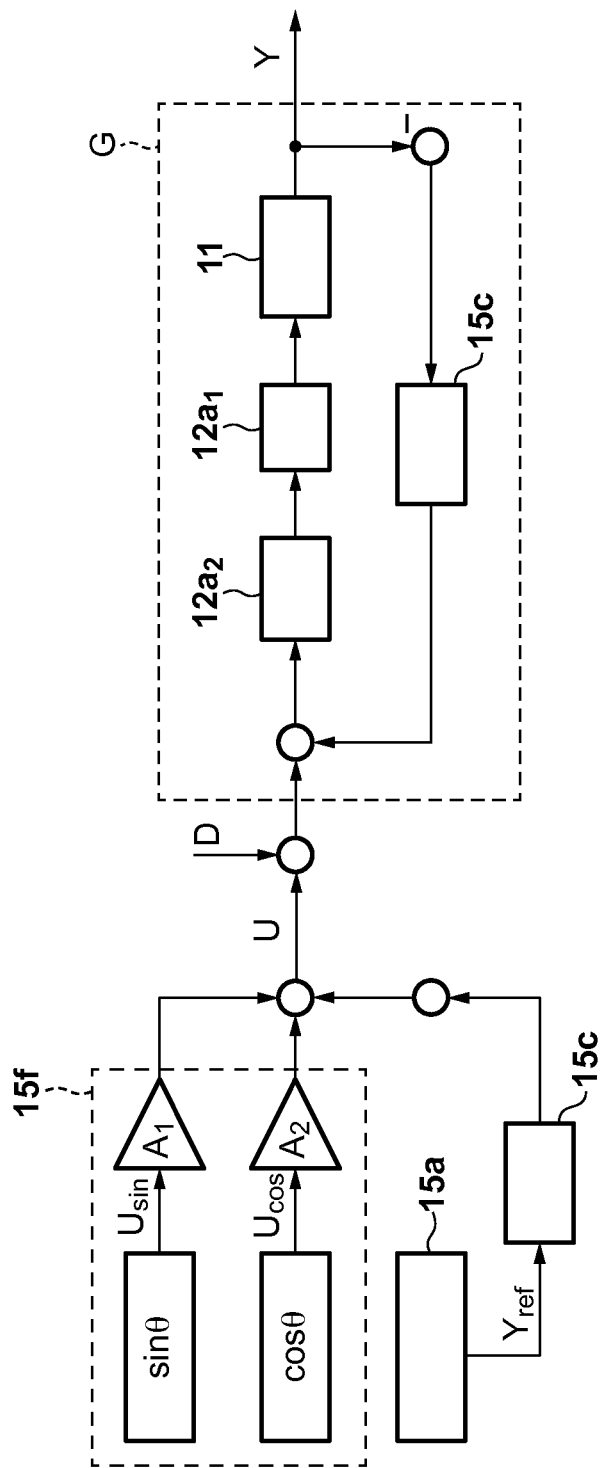
FIG. 4 is a block line diagram showing the control system according to the first embodiment.

Next, a method for determining the second signal in step S105 will be described. In the following description, a description will be given in which the block line diagram shown in FIG. 2 is replaced with the block line diagram shown in FIG. 4 for the sake of formulation. The thrust ripple d in the block line diagram shown in FIG. 2 is subjected to equivalent transformation for the sake of formulation, and is written as a data string D for the thrust ripple after the adder 15d in the block line diagram shown in FIG. 4. Also, since the feed-forward signal FF shown in FIG. 2 is not needed for determining the second signal, the feed-forward signal FF is not shown in the block line diagram shown in FIG. 4. At this time, if it is assumed that the stage apparatus 100 according to the first embodiment is a linear time invariant system (LTI system), equation (3) holds true in the block line diagram shown in FIG. 4.

$$Y = GU + GD \qquad (3)$$

$$Y = \begin{bmatrix} POS[0] \\ POS[1] \\ \vdots \\ POS[N-1] \end{bmatrix},$$

$$U = \begin{bmatrix} u[0] \\ u[1] \\ \vdots \\ u[N-1] \end{bmatrix},$$

$$G = \begin{bmatrix} g_0 & 0 & 0 & 0 \\ g_1 & g_0 & 0 & 0 \\ g_2 & g_1 & g_0 & 0 \\ \vdots & \vdots & \vdots & \vdots \end{bmatrix}$$

In equation (3), Y represents a data string for positions of the stage 11 at times 0 to N−1, and U represents a data string for composite signals u composed of the first signals and the second signals at times 0 to N−1. Also, D represents a data string for the signals resulting from equivalent transformation such that the thrust ripple d is added to the position of the adder 15d at times 0 to N−1. G represents a function (e.g., a transfer function) whose inputs are the data string U and the data string D and whose output is the data string Y, and is defined such that equation (3) holds true. Here, the data string U for the composite signals u can be expressed according to equation (4). In equation (4), $U_d$ represents a data string for the first signals at times 0 to N−1. Also, $U_{sin}$ represents a data string for the first item of equation (2) that indicates the second signal at times 0 to N−1, and $U_{cos}$ represents a data string for the second item of equation (2) that indicates the second signal at times 0 to N−1.

$$U = A_1 U_{sin} + A_2 U_{cos} + U_d \qquad (4)$$

According to equation (3) and equation (4), data string Y for the position of the stage 11 is expressed by equation (5). Also, when equation (5) is summarized with respect to parameters $A_1$ and $A_2$, the data string Y is expressed by equation (6).

$$Y = G(A_1 U_{sin}) + G(A_2 U_{cos}) + GU_d + GD \qquad (5)$$

$$Y = [\, GU_{sin} \quad GU_{cos} \quad GU_d + GD \,] \begin{bmatrix} A_1 \\ A_2 \\ 1 \end{bmatrix} \qquad (6)$$

Letting $A_{i1}$ and $A_{i2}$ be the parameters at the time when the processes of the above-described steps S101 to S103 have been executed the i-th time and $Y_i$ be the data string for the position of the stage 11 in the information acquired at this time (position profile), data string $Y_i$ is expressed by equation (7). Accordingly, when the data string $Y_i$ for n pieces of information acquired by executing the process of steps S101 to S103 n times is summarized, equation (8) can be obtained. In equation (8), $Y_{ex}$ represents a matrix of data strings $Y_i$ for the position of the stage 11 obtained using n pieces of information, and X represents a matrix of parameters $A_{i1}$ and $A_{i2}$, which are used at the time of acquiring n pieces of information.

$$Y_i = [GU_{sin}\ GU_{cos}\ GU_d + GD] \begin{bmatrix} A_{i1} \\ A_{i2} \\ 1 \end{bmatrix}$$

$$i = 1, 2, 3, \ldots, n \qquad (7)$$

$$Y_{ex} = \Sigma X$$

$$Y_{ex} = [Y_1\ Y_2 \ldots Y_n]$$

$$\Sigma = [GU_{sin}\ GU_{cos}\ GU_d + GD]$$

$$X = \begin{bmatrix} A_{11} & A_{21} & \ldots & A_{n1} \\ A_{12} & A_{22} & \ldots & A_{n1} \\ 1 & 1 & \ldots & 1 \end{bmatrix} \qquad (8)$$

Here, since equation (8) is a linear equation using matrices, Σ can be determined by using $X^T(XX^T)^{-1}$ as the pseudo-inverse matrix of X. Since equation (9) holds true due to $XX^T$ having a full rank, the parameters used in the process of steps S101 to S103 may be set such that X has full row rank. Σ, which is determined using multiple pieces of information in this way, is a function whose input is the second signal and whose output is the position of the stage, and equation (10) can be obtained due to the fact that $\Sigma = [GU_{sin}\ GU_{cos}\ GU_d + GD]$ in equation (8). In equation (10), $Y_{th}$ represents a data string for the positions of the stage 11 (estimated positions of the stage 11) that are estimated when $A_{th1}$ and $A_{th2}$ are set as the parameters $A_1$ and $A_2$ of the second signal.

$$\Sigma = Y_{ex} X^T (XX^T)^{-1} \qquad (9)$$

$$Y_{th} = \sum \begin{bmatrix} A_{th1} \\ A_{th2} \\ 1 \end{bmatrix} \qquad (10)$$

Letting $Y_{ref}$ be a data string at times 0 to N−1 for the target positions REF used when the stage 11 is driven in step S102, the data string $Y_{ref}$ is indicated by equation (11). Accordingly, a difference $Y_{err}$ between the data string $Y_{th}$ and the data string $Y_{ref}$ is indicated by equation (12). Due to the fact that the data string $Y_{th}$ is a function of the parameters $A_{th1}$ and $A_{th2}$ according to equation (10), the difference $Y_{err}$ is also a function of the parameters $A_{th1}$ and $A_{th2}$. That is to say, the difference $Y_{err}$ is indicated by equation (13).

$$Y_{ref} = \begin{bmatrix} REF[0] \\ REF[1] \\ \vdots \\ REF[N-1] \end{bmatrix} \qquad (11)$$

$$Y_{err} = Y_{ref} - Y_{th} \qquad (12)$$

$$Y_{err}(A_{th1}, A_{th2}) = Y_{ref} - \sum \begin{bmatrix} A_{th1} \\ A_{th2} \\ 1 \end{bmatrix} \qquad (13)$$

Here, the data string $Y_{th}$ indicates a data string for the estimated positions of the stage 11 as described above, in which the vibration of the stage 11 caused by the thrust ripple is included. On the other hand, the data string $Y_{ref}$ indicates a data string for the target positions of the stage 11, in which the vibration of the stage 11 caused by the thrust ripple is not included. That is to say, the difference $Y_{err}$ represents the vibration of the stage 11 caused by the thrust ripple. For this reason, by obtaining the parameters $A_{th1}$ and $A_{th2}$ such that the difference $Y_{err}$ falls within an allowable range, the control unit 15 can determine the second signal such that the amplitude of the vibration of the stage 11 falls within an allowable range. In particular, the control unit 15 may obtain the parameters $A_{th1}$ and $A_{th2}$ such that the difference $Y_{err}$ is reduced (e.g., is minimized).

The problem of minimizing an evaluation function (objective function) for a multivariate function such as that shown in equation (13) is generally called an optimization problem, and can be solved using a least squares method, the downhill simplex method proposed by Nelder and Mead, or the like. The simplex method is included in MATLAB, which is known as numerical analysis software, in a form such as an fminsearch command, and therefore a solution can be found using such a tool. For example, if the evaluation function is expressed using equation (14), the solutions ($A_{opt2}$ and $A_{opt2}$) for the parameters ($A_{th1}$ and $A_{th2}$) whose difference $Y_{err}$ is to be minimized can be obtained as in equation (15), using a least squares method. Also, it is possible to obtain a solution using the simplex method in the case where the evaluation function is expressed as equation (16) and the absolute value of the amplitude is to be minimized, or in the case where the evaluation function is expressed as equation (17) and the difference between the maximum value and minimum value of the amplitude is to be minimized. Furthermore, the evaluation function may be expressed such that and the frequency spectrum corresponding to the thrust ripple is minimized by subjecting the value of the deviation between the position of the stage 11 and the target position to frequency analysis.

$$J = \|Y_{err}(A_{th1}, A_{th2})\| \qquad (14)$$

$$\begin{bmatrix} A_{opt1} \\ A_{opt2} \\ 1 \end{bmatrix} = \sum\nolimits^T \left( \sum \sum\nolimits^T \right)^{-1} Y_{ref} \qquad (15)$$

$$J = \max |Y_{err}(A_{th1}, A_{th2})| \qquad (16)$$

$$J = \max\{Y_{err}(A_{th1}, A_{th2})\} - \min\{Y_{err}(A_{th1}, A_{th2})\} \qquad (17)$$

Figure 5:
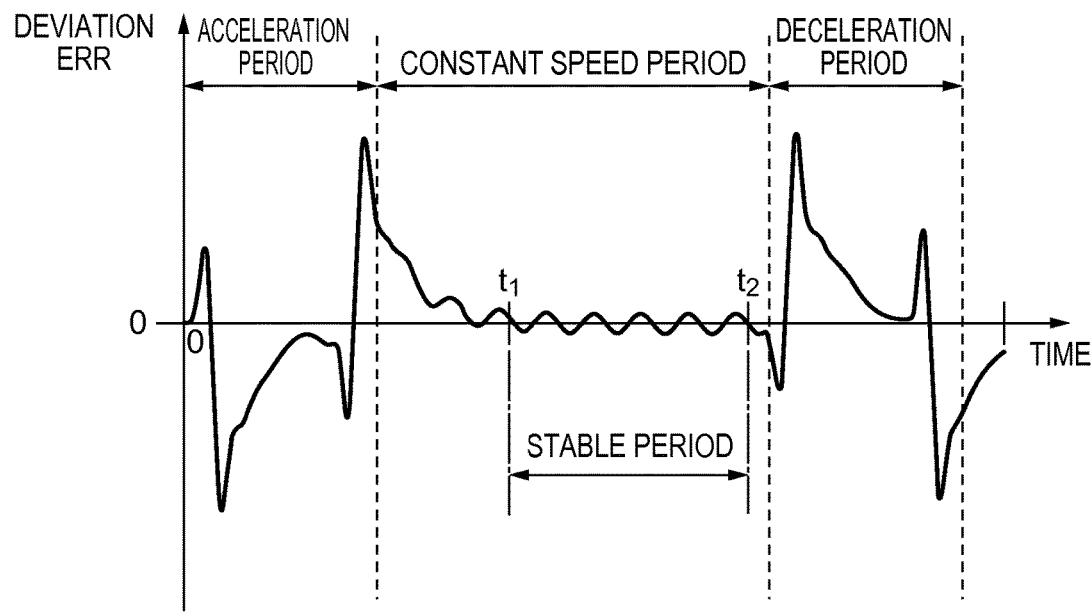
FIG. 5 is a diagram showing a deviation between a position of a stage while the stage is being driven and a target position.

Here, in a period of accelerating the stage 11 and a period of decelerating the stage 11, the stage 11 sometimes vibrates due to a disturbance other than a thrust ripple. FIG. 5 is a diagram showing a deviation ERR between the position of the stage 11 while the stage 11 is being driven, and the target position. The vertical axis in FIG. 5 indicates the deviation ERR between the position of the stage 11 and the target position, and the horizontal axis indicates the time. As shown in FIG. 5, it is understood that in the period of accelerating the stage 11 and the period of decelerating the stage 11, the deviation ERR is larger in comparison to the period in which the stage 11 is moving at a constant speed. For this reason, if a period in which the deviation ERR increases in this way is included in the position profile of the pieces of information used for determining the second signal, it can be difficult to accurately determine the second signal for reducing the vibration of the stage 11 caused by the thrust ripple. Accordingly, in the processing of steps S101 to S103, the control unit 15 may control the position of the stage such that the position profile of the stage 11 in the period during which the stage 11 moves at a constant speed is included in the pieces of information. In such a case, the control unit 15 may determine the second signal using the position profile of the stage 11 in the period during which the stage 11 is moving at a constant speed.

Also, even in the period during which the stage 11 moves at a constant speed, immediately after the acceleration of the stage 11 ends, the deviation ERR is large compared to the period during which the vibration of the stage 11 is stable (constant). Accordingly, in the processing of steps S101 to S103, it is sufficient that the control unit 15 controls the position of the stage such that the position profile of the stage 11 in the period during which the stage 11 moves at a constant speed and the vibration of the stage 11 is constant is included in the pieces of information. In such a case, the control unit 15 may determine the second signal using the position profile of the stage 11 in the period during which the stage 11 is moving at a constant speed and the vibration of the stage 11 is constant.

For example, as shown in FIG. 5, if it is assumed that the vibration of the stage 11 is constant in the period from time $t_1$ to $t_2$, the control unit 15 obtains the pieces of information such that the position profile of the stage 11 in the period from time $t_1$ to $t_2$ is included therein. Then, the control unit 15 may determine the second signal by performing the processing of step S104 using the pieces of information. At this time, the data string $Y_i$ indicated by equation (3) and the data string $Y_{ref}$ indicated by equation (11) can be indicated by equation (18). Accordingly, the control unit 15 can accurately determine the second signal for reducing the vibration of the stage 11 caused by the thrust ripple.

$$Y_i = \begin{bmatrix} POS[t_1] \\ POS[t_1+\Delta] \\ \vdots \\ POS[t_2] \end{bmatrix}, Y_{ref} = \begin{bmatrix} REF[t_1] \\ REF[t_1+\Delta] \\ \vdots \\ REF[t_2] \end{bmatrix} \quad (18)$$

Furthermore, there are cases where the thrust ripple includes multiple frequency components. In such a case, a sine wave signal S expressed by equation (19) may be used as the arbitrary signal that is used instead of the second signal in the processing of steps S101 to S103. At this time, X in equation (8) can be expressed by equation (20).

$$S = A_1 \sin \theta + A_2 \cos \theta + A_3 \sin 2\theta + A_4 \cos 2\theta + A_5 \sin 3\theta + A_6 \cos 3\theta \ldots \quad (19)$$

$$X = \begin{bmatrix} A_{11} & A_{21} & A_{31} & \ldots & A_{n1} \\ A_{12} & A_{22} & A_{32} & \ldots & A_{n2} \\ \vdots & \vdots & \vdots & \ddots & \vdots \\ A_{1x} & A_{2x} & A_{3x} & \ldots & A_{nx} \\ 1 & 1 & 1 & \ldots & 1 \end{bmatrix} \quad (20)$$

Figure 6:
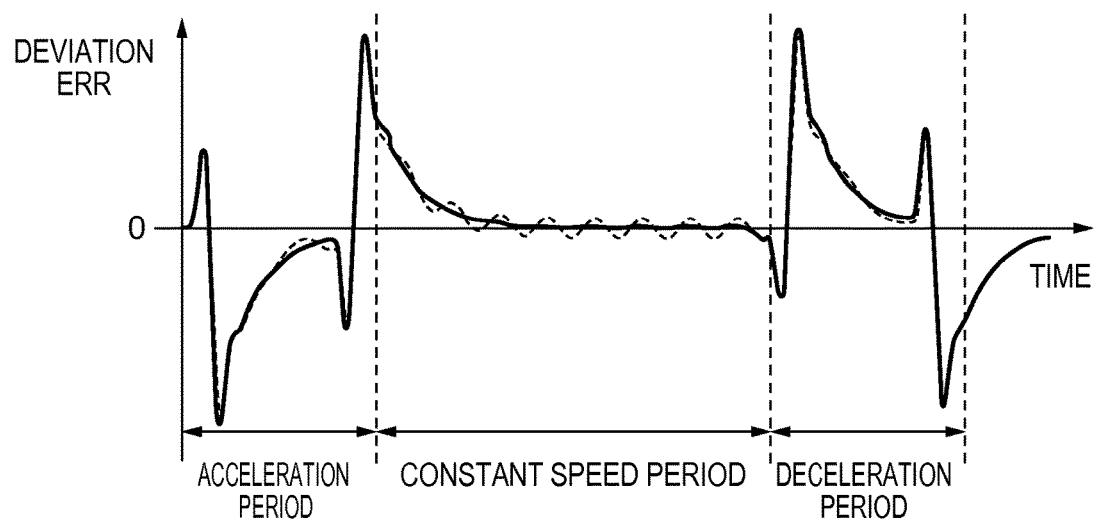
FIG. 6 is a diagram showing results of examining vibration of a stage in a case where the second signal is supplied to a driving unit and in a case where the second signal is not supplied.

By setting the second signal determined in step S104 in this way in the second supply unit 15f, the composite signal u composed of the second signal and the first signal determined in step S104 can be supplied to the driving unit 12 (driver 12$a_2$). Accordingly, the amplitude of the vibration of the stage 11 caused by the thrust ripple can be brought within the allowable range. That is to say, the amplitude of the vibration of the stage 11 caused by the thrust ripple can be suppressed. FIG. 6 is a diagram showing results of examining the vibration of the stage 11 in the case where the second signal determined in step S104 is supplied to the driving unit 12, and in a case where the second signal is not supplied. The vertical axis in FIG. 6 indicates the deviation ERR between the position of the stage 11 and the target position, and the horizontal axis indicates the time. Also, in FIG. 6, the solid line indicates the vibration of the stage 11 in the case where the second signal determined in step S104 is supplied to the driving unit 12, and the broken line indicates the vibration of the stage 11 in the case where the second signal is not supplied to the driving unit 12. As shown in FIG. 6, it is understood that the vibration of the stage 11 caused by the thrust ripple is suppressed by supplying the second signal determined in step S104 to the driving unit 12.

As described above, with the stage apparatus 100 of the first embodiment, the control unit 15 acquires multiple pieces of information indicating the response of the stage 11 when multiple arbitrary signals are using instead of the second signal. Then, based on the acquired multiple pieces of information, the control unit 15 determines the second signal for reducing the vibration of the stage 11 caused by the thrust ripple, such that the amplitude of the vibration of the stage 11 falls within an allowable range. By using the thus-determined second signal, the stage apparatus 100 of the first embodiment can reduce the vibration of the stage 11 caused by the thrust ripple.

Second Embodiment

Figure 7:
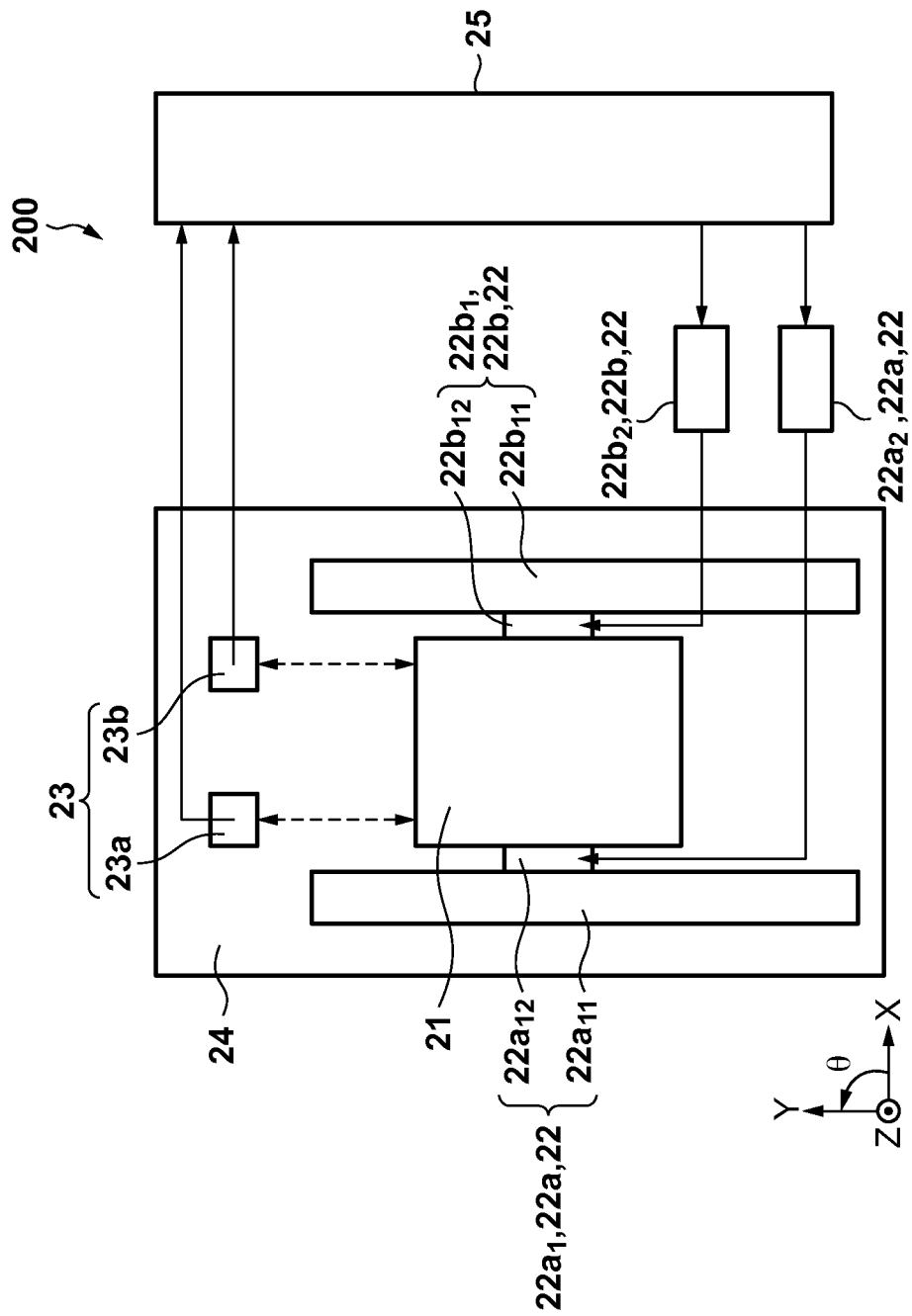
FIG. 7 is a schematic diagram showing a stage apparatus of a second embodiment.

A stage apparatus 200 according to a second embodiment of the present invention will be described with reference to FIG. 7. FIG. 7 is a schematic diagram showing the stage apparatus 200 of the second embodiment. The stage apparatus 200 of the second embodiment is configured to control not only the position of the stage in the Y direction, but also the position (rotation) of the stage in the θ direction (direction of rotation about the Z axis). The stage apparatus 200 of the second embodiment can include a stage 21 that can move on a base 24, a driving unit 22 that drives the stage 21, a measuring unit 23 that measures the position of the stage 21, and a control unit 25. Similarly to the control unit 15 of the first embodiment, the control unit 25 includes a CPU, memory, or the like, for example, and controls the units of the stage apparatus 200. Here, in the second embodiment, in order to simplify the description, a method of controlling the position of the stage 21 in the Y direction and the θ direction will be described, but the position of the stage 21 can be controlled in the X direction as well using a similar method.

The driving unit 22 can include a first driving unit 22a that provides thrust to the portion on the –X direction side of the stage 21, and a second driving unit 22b that provides thrust to the portion on the +X direction side of the stage 21. In the second embodiment, the first driving unit 22a can include a linear motor 22$a_1$ having a stator 22$a_{11}$ and a movable element 22$a_{12}$, and a driver 22$a_2$ that supplies electricity to the linear motor 22$a_1$ (e.g., the movable element 22$a_{12}$) according to a signal supplied from the control unit 25. The stator 22$a_{11}$ of the linear motor 22$a_1$ is fixed to a base 24, and the movable element 22$a_{12}$ is fixed to the stage 21. Also, the driver 22$a_2$ can drive the portion on the –X direction side of the stage 21 in the Y direction by supplying current to the linear motor 22$a_1$ according to a signal supplied from the control unit 25. Also, the second driving unit 22b can include a linear motor 22$b_1$ having a stator 22$b_{11}$ and a movable element 22$b_{12}$, and a driver 22$b_2$ that supplies current to the linear motor 22$b_1$ (e.g., the movable element 22$b_{12}$) according to the signal supplied from the control unit 25. The stator 22$b_{11}$ of the linear motor 22$b_1$ is fixed to the base 24, and the movable element 22$b_{12}$ is fixed to the stage 21. Also, the driver 22$b_2$ can drive the portion toward the +X direction of the stage 21 in the Y direction by supplying current to the linear motor 22$b_1$ according to a signal supplied from the control unit 25.

The position of the stage 21 in the Y direction can be measured by a measuring unit 23 provided on the base 24. The measuring unit 23 can include a first measuring unit 23a that measures the position of the portion on the –X direction side of the stage 21, and a second measuring unit 23b that measures the position of the portion on the +X direction side of the stage 21. The first measuring unit 23a and the second measuring unit 23b can each include a laser interferometer, for example. Also, the measuring units 23a and 23b emit laser beams to the side surface of the stage 21 (mirrors), obtain the displacement from the reference position of the stage 21 using the laser beams reflected by the side surface, and can obtain the current position of the units of the stage 21 based on the displacement. The control unit 25 can obtain the current position of the stage 21 in the Y direction and the θ direction by performing a coordinate transformation on the result of the measurement performed by the first measuring unit 23a and the result of the measurement performed by the second measuring unit 23b. Also, the control unit 25 positions the stage 21 by controlling the first driving unit 22a and the second driving unit 22b such that the deviation between the current position of the stage 21 (Y direction and θ direction) and the target position approaches zero.

With the thus-configured stage apparatus 200, the thrust ripples between the first driving unit 22a and the second driving unit 22b are sometimes different from each other due to the properties of the linear motor and the driver being different between the first driving unit 22a and the second driving unit 22b. At this time, vibration of the stage 21 can occur not only in the Y direction but in the θ direction as well. In view of this, the stage apparatus 200 of the second embodiment generates the second signal for reducing the vibration of the stage 21 caused by the thrust ripple with respect to not only the Y direction but to the θ direction as well.

Figure 8:
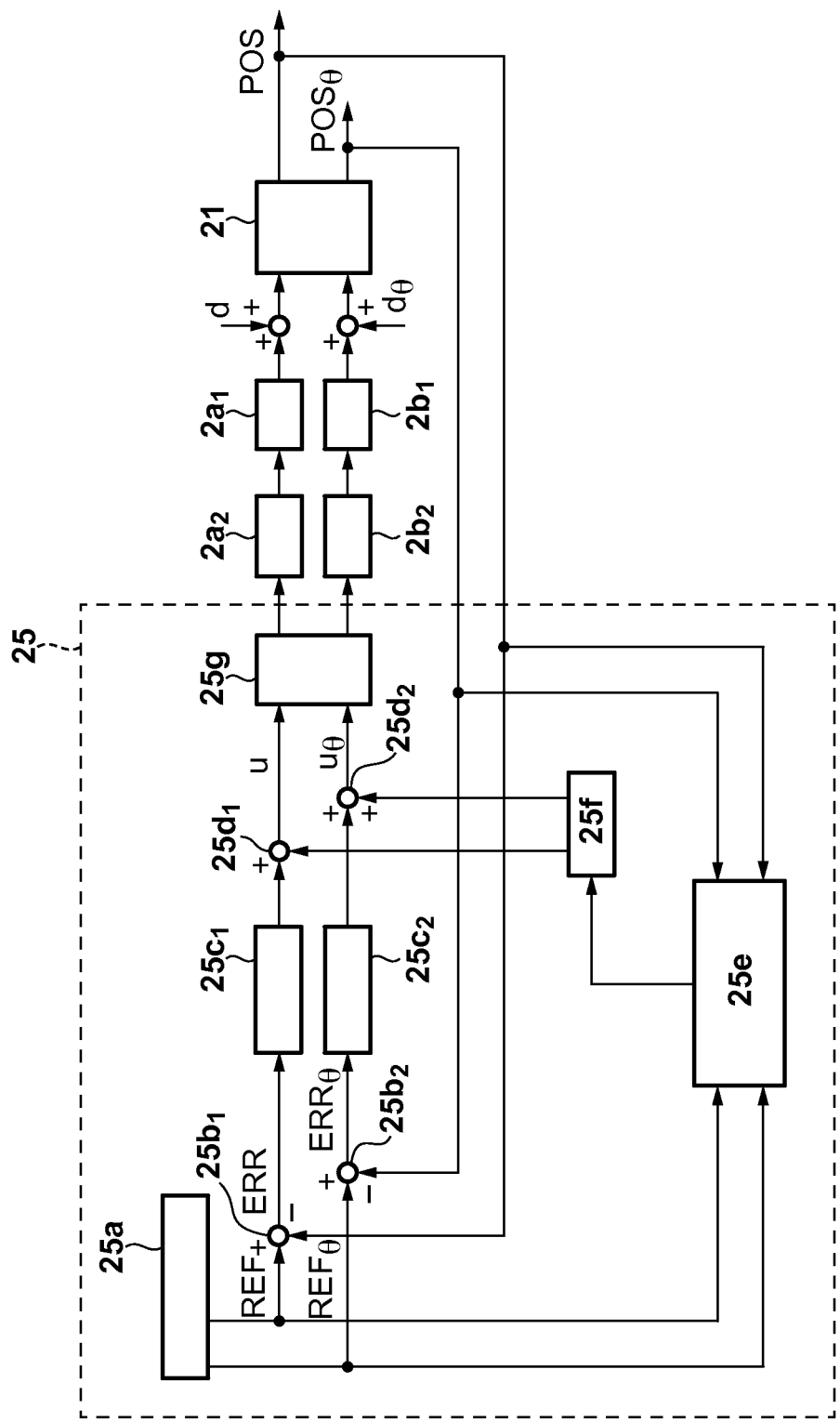
FIG. 8 is a block line diagram showing a control system according to the second embodiment.

FIG. 8 is a block line diagram showing a control system according to the second embodiment. The control system according to the second embodiment can include a control system for controlling the position of the stage 21 in the θ direction in addition to a control system for controlling the position of the stage 21 in the Y direction. In FIG. 2, the control unit 25 includes a first supply unit 25a, a first subtractor $25b_1$, a second subtractor $25b_2$, a first compensator $25c_1$, a second compensator $25c_2$, a first adder $25d_1$, a second adder $25d_2$, a generator 25e, a second supply unit 25f, and a processor 25g.

With the control system for controlling the position of the stage 21 in the Y direction, a command value for the target position REF in the Y direction of the stage 21 is supplied from the first supply unit 25a to the first subtractor $25b_1$. Based on the command value supplied from the first supply unit 25a, the first subtractor $25b_1$ calculates a deviation ERR between the current position POS in the Y direction of the stage 21 and the target position REF. The first compensator $25c_1$ is a PID compensator, for example, which generates a signal (first signal in the Y direction) for reducing the deviation ERR calculated by the first subtractor $25b_1$. the first compensator $25c_1$ may generate the first signal in the Y direction such that the deviation ERR calculated by the first subtractor $25b_1$ approaches zero. The first signal in the Y direction generated by the first compensator $25c_1$ is supplied to the first adder $25d_1$. On the other hand, the generator 25e generates a signal (second signal in the Y direction) for reducing the vibration of the stage 21 in the Y direction that occurs due to the thrust ripple. The second signal in the Y direction generated by the generator 25e is supplied to the first adder $25d_1$ by the second supply unit 25f. The first adder $25d_1$ supplies a composite signal u composed of the first signal in the Y direction and the second signal in the Y direction to the processor 25g.

Also, with the control system for controlling the position of the stage 21 in the θ direction, a command value for the target position $REF_θ$ in the θ direction of the stage 21 is supplied from the first supply unit 25a to the second subtractor $25b_2$. Based on the command value supplied from the first supply unit 25a, the second subtractor $25b_2$ calculates a deviation $ERR_θ$ between the current position $POS_θ$ in the θ direction of the stage 21 and the target position $REF_θ$. The second compensator $25c_2$ is a PID compensator, for example, which generates a signal (first signal in the θ direction) for reducing the deviation $ERR_θ$ calculated by the second subtractor $25b_2$. the second compensator $25c_2$ may generate the first signal in the θ direction such that the deviation $ERR_θ$ calculated by the second subtractor $25b_2$ approaches zero. The first signal in the θ direction generated by the second compensator $25c_2$ is supplied to the second adder $25d_2$. On the other hand, in addition to the second signal in the Y direction, the generator 25e also generates a signal (second signal in the θ direction) for reducing the vibration of the stage 21 in the θ direction that is generated by the thrust ripple. The second signal in the θ direction generated by the generator 25e is supplied to the second adder $25d_2$ by the second supply unit 25f. The second adder $25d_2$ supplies a composite signal $u_θ$ composed of the first signal in the θ direction and the second signal in the θ direction to the processor 25g.

Based on the supplied composite signals u and $u_θ$, the processor 25g performs processing for generating a signal to be supplied to the driver $22a_2$ of the first driving unit 22a and a signal to be supplied to the driver $22b_2$ of the second driving unit 22b. The driver $22a_2$ of the first driving unit 22a supplies current to the linear motor $22a_1$ according to the signal supplied from the processor 25g. Also, the second driving unit 22b supplies current to the linear motor $22b_1$ according to the signal supplied from the processor 25g. According to this kind of control, the stage apparatus 200 can position the stage 21 such that the deviation between the current position of the stage 21 and the target position is reduced, and such that vibration of the stage 21 caused by the thrust ripple is reduced, in both the Y direction and the θ direction.

Here, a method for generating the second signal in the Y direction and the second signal in the θ direction in the control unit 25 (generator 25e) will be described. The control unit 25 generates the second signal in the Y direction and the second signal in the θ direction in accordance with the flowchart shown in FIG. 3. With the stage apparatus 200 of the second embodiment, the processing of step S105 in FIG. 3 is different compared to that of the stage apparatus 100 of the first embodiment, and therefore the processing of step S105 will be described below.

Figure 9:
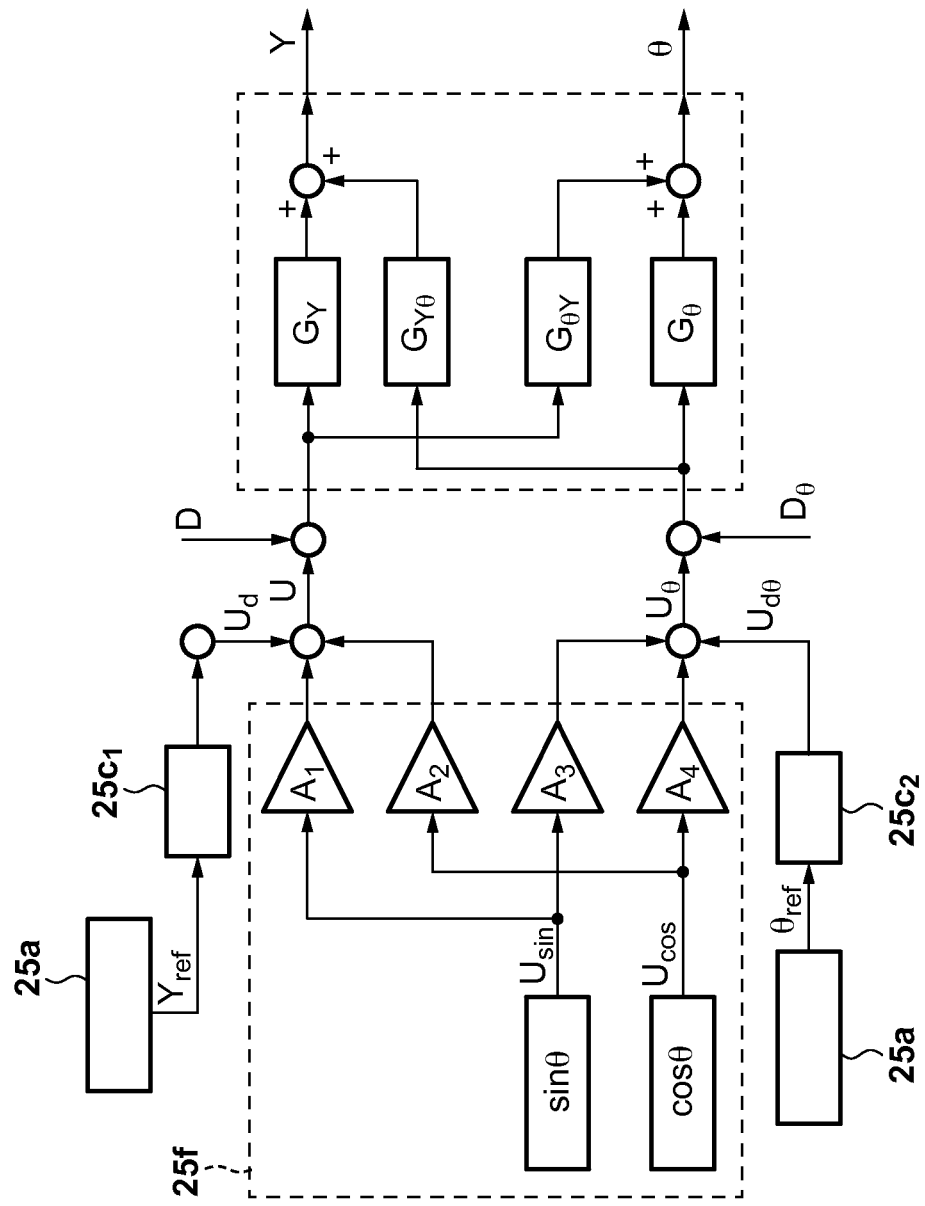
FIG. 9 is a block line diagram showing the control system according to the second embodiment.

In step S105, based on the multiple pieces of information acquired by repeating steps S101 to S103, the control unit 25 determines the second signal in the Y direction and the second signal in the θ direction such that the amplitude of the vibration of the stage 21 caused by the thrust ripple falls within an allowable range. In the following description, a description will be given in which the block line diagram shown in FIG. 8 is replaced with the block line diagram shown in FIG. 9 for the sake of formulation. Here, in the block line diagram shown in FIG. 8, the thrust ripple in the thrust provided to the stage 21 is written as thrust ripple $d_a$ for the first driving unit 22a and thrust ripple $d_b$ for the second driving unit 22b. On the other hand, in the block line diagram shown in FIG. 9, for the sake of formulation, they are written as data string D for the thrust ripple in the Y direction and data string $D_θ$ for the thrust ripple in the θ direction. At this time, if it is assumed that the stage apparatus 200 according to the second embodiment is an LTI system, equation (21) holds true in the block line diagram shown in FIG. 9.

$$Y = G_Y(U+D) + G_{Yθ}(U_θ + D_θ)$$

$$Θ = G_θ(U_θ + D_θ) + G_{θY}(U+D)$$

$$Y = \begin{bmatrix} POS[0] \\ POS[1] \\ \vdots \\ POS[N-1] \end{bmatrix}, U = \begin{bmatrix} u[0] \\ u[1] \\ \vdots \\ u[N-1] \end{bmatrix}, \quad (21)$$

$$Θ = \begin{bmatrix} POS_θ[0] \\ POS_θ[1] \\ \vdots \\ POS_θ[N-1] \end{bmatrix}, U_θ = \begin{bmatrix} u_θ[0] \\ u_θ[0] \\ \vdots \\ u_θ[N-1] \end{bmatrix}$$

In equation (21), Y represents a data string for the positions of the stage in the Y direction at times 0 to N−1, and Θ represents a data string for the positions of the stage in the θ direction at times 0 to N−1. U represents a data string for the composite signals u composed of the first signal and the second signal in the Y direction at times 0 to N−1, and $U_θ$ represents a data string for the composite signals $u_θ$ composed of the first signal and the second signal in the θ direction at times 0 to N−1. D represents a data string for the thrust ripples in the Y direction at times 0 to N1, and $D_θ$ represents a data string for the thrust ripples in the θ direction at times 0 to N−1. $G_{Yθ}$ represents a function whose inputs are the data string $U_θ$ and the data string $D_θ$ and whose output is the position of the stage 21 in the Y direction, and $G_{θY}$ represents a function whose inputs are the data string U and the data string D and whose output is the position of the stage 21 in the θ direction. $G_{Yθ}$ and $G_{θY}$ are defined such that equation (21) holds true. Here, the data string U and the data string $U_θ$ can be expressed by equation (22). In equation (22), $U_d$ represents a data string for the first signals in the Y direction at times 0 to N−1, and $U_{dθ}$ represents a data string for the first signals in the θ direction at times 0 to N−1. Also, similarly to the first embodiment, $U_{sin}$ represents a data string for the first item of equation (2) that indicates the second signal, at times 0 to N−1, and $U_{cos}$ represents a data string for the second item of equation (2) that indicates the second signal, at times 0 to N−1.

$$U = A_1 U_{sin} + A_2 U_{cos} + U_d$$

$$U_θ = A_3 U_{sin} + A_4 U_{cos} + U_{dθ} \quad (22)$$

According to equation (21) and equation (22), data string Y for the position of the stage 21 in the Y direction and data string Θ for the position of the stage 21 in the θ direction are expressed using equation (23). Also, if equation (22) is summarized with respect to parameters $A_1$, $A_2$, $A_3$, and $A_4$, the data string Y and the data string Θ are expressed by equation (24).

$$Y = G_Y(A_1 U_{sin}) + G_Y(A_2 U_{cos}) + G_Y(U_d + D) + G_{Yθ}(A_3 U_{sin}) + G_{Yθ}(A_4 U_{cos}) + G_{Yθ}(U_{dθ} + D_θ)$$

$$Θ = G_θ(A_3 U_{sin}) + G_θ(A_4 U_{cos}) + G_θ(U_{dθ} + D_θ) + G_{θY}(A_1 U_{sin}) + G_{θY}(A_2 U_{cos}) + G_{θY}(U_d + D) \quad (23)$$

$$Y = [G_Y U_{sin} \; G_Y U_{cos} \; G_{Yθ} U_{sin} \; G_{Yθ} U_{cos} \; G_Y(U_d + D) + G_{Yθ}(U_{dθ} + D_θ)] \begin{bmatrix} A_1 \\ A_2 \\ A_3 \\ A_4 \\ 1 \end{bmatrix} \quad (24)$$

$$Θ = [G_{θY} U_{sin} \; G_{θY} U_{cos} \; G_θ U_{sin} \; G_θ U_{cos} \; G_θ(U_{dθ} + D_θ) + G_{θY}(U_d + D)] \begin{bmatrix} A_1 \\ A_2 \\ A_3 \\ A_4 \\ 1 \end{bmatrix}$$

The parameters for when the above-described processing of steps S101 to S103 is executed for the i-th time are $A_{i1}$, $A_{i2}$, $A_{i3}$, and $A_{i4}$, and the data strings for the positions of the stage 21 in Y direction and the θ direction in the information obtained at that time are $Y_i$ and $Θ_i$. At this time, the data string $Y_i$ and the data string $Θ_i$ can be expressed using equation (25). Accordingly, when the data strings $Y_i$ for n pieces of information acquired by executing the processing of steps S101 to S103 n times are summarized, equation (26) can be obtained. In equation (26), $Y_{ex}$ represents a matrix for the data strings $Y_i$ for the positions of the stage 21 obtained using n pieces of information, and $X_Y$ represents a matrix for the parameters $A_{i1}$, $A_{i2}$, $A_{i3}$, and $A_{i4}$ which are used when n pieces of information are obtained. Also, upon compiling the data strings $Θ_i$ for n pieces of information acquired by executing the process of steps S101 to S103 n times, equation (27) can be obtained. In equation (27), $Θ_{ex}$ represents a matrix for the data strings $Θ_i$ for the positions of the stage 21 obtained using n pieces of information, and $X_θ$ represents a matrix for the parameters $A_{i1}$, $A_{i2}$, $A_{i3}$ and $A_{i4}$ which are used when n pieces of information are obtained.

$$Y_i = [G_Y U_{sin} \; G_Y U_{cos} \; G_{Yθ} U_{sin} \; G_{Yθ} U_{cos} \; G_Y(U_d + D) + G_{Yθ}(U_{dθ} + D_θ)] \begin{bmatrix} A_{i1} \\ A_{i2} \\ A_{i3} \\ A_{i4} \\ 1 \end{bmatrix} \quad (25)$$

$$Θ_i = [G_{θY} U_{sin} \; G_{θY} U_{cos} \; G_θ U_{sin} \; G_θ U_{cos} \; G_θ(U_{dθ} + D_θ) + G_{θY}(U_d + D)] \begin{bmatrix} A_{i1} \\ A_{i2} \\ A_{i3} \\ A_{i4} \\ 1 \end{bmatrix}$$

$$Y_{ex} = Σ_Y X_Y$$

$$Y_{ex} = [Y_1 \; Y_2 \; \ldots \; Y_n]$$

$$Σ_Y = [G_Y U_{sin} \; G_Y U_{cos} \; G_{Yθ} U_{sin} \; G_{Yθ} U_{cos} \; G_Y(U_d + D) + G_{Yθ}(U_{dθ} + D_θ)]$$

$$X_Y = \begin{bmatrix} A_{11} & A_{21} & \ldots & A_{n1} \\ A_{12} & A_{22} & \ldots & A_{n2} \\ A_{13} & A_{23} & \ldots & A_{n3} \\ A_{14} & A_{24} & \ldots & A_{n4} \\ 1 & 1 & \ldots & 1 \end{bmatrix} \quad (26)$$

$$Θ_{ex} = Σ_θ X_θ$$

$$Y_{ex} = [Y_1 \; Y_2 \; \ldots \; Y_n]$$

$$Σ_θ = [G_{θY} U_{sin} \; G_{θY} U_{cos} \; G_θ U_{sin} \; G_θ U_{cos} \; G_θ(U_{dθ} + D_θ) + G_{θY}(U_d + D)]$$

$$X_θ = \begin{bmatrix} A_{11} & A_{21} & \ldots & A_{n1} \\ A_{12} & A_{22} & \ldots & A_{n2} \\ A_{13} & A_{23} & \ldots & A_{n3} \\ A_{14} & A_{24} & \ldots & A_{n4} \\ 1 & 1 & \ldots & 1 \end{bmatrix} \quad (27)$$

Here, if the parameters for the arbitrary signal used in the processing of steps S101 to S103 are selected such that $X_Y$ and $X_θ$ each have full rank, $Σ_Y$ and $Σ_θ$ can be determined based on the pseudo-inverse matrices of $X_Y$ and $X_θ$. Equation (28) indicates $\Sigma_Y$ and $\Sigma_\theta$. $\Sigma_Y$ and $\Sigma_\theta$, which are determined using multiple pieces of information in this way, are functions whose input is the second signal and whose output is the position of the stage. For this reason, the data string $Y_{th}$ for the estimated positions of the stage 21 in the Y direction and the data string $\Theta_{th}$ for the estimated positions of the stage 21 in the θ direction can be expressed by equation (29). In equation (29), $Y_{th}$ indicates a data string for the estimated position of the stage 21 when $A_{th1}$ to $A_{th4}$ are set as the parameters $A_1$ to $A_4$ of the second signal. Also, $\Theta_{th}$ indicates a data string for the estimated positions of the stage 21 when $A_{th1}$ to $A_{th4}$ are set as the parameters $A_1$ to $A_4$ of the second signal.

$$\Sigma_Y = Y_{ex} X_Y^T (X_Y X_Y^T)^{-1}$$

$$\Sigma_\theta = \Theta_{ex} X_\theta^T (X_\theta X_\theta^T)^{-1} \qquad (28)$$

$$Y_{th} = \sum_Y \begin{bmatrix} A_{th1} \\ A_{th2} \\ A_{th3} \\ A_{th4} \\ 1 \end{bmatrix}, \Theta_{th} = \sum_\theta \begin{bmatrix} A_{th1} \\ A_{th2} \\ A_{th3} \\ A_{th4} \\ 1 \end{bmatrix} \qquad (29)$$

The data string $Y_{ref}$ and the data string $\Theta_{ref}$ at times 0 to $N-1$ for the target positions used when the stage 21 is to be driven in step S102, can be expressed by equation (30). Also, a difference $Y_{err}$ between the data string $Y_{th}$ and the data string $Y_{ref}$ and a difference $\Theta_{err}$ between the data string $\Theta_{th}$ and the data string $\Theta_{ref}$ are expressed by equation (31). The control unit 25 obtains the parameters $A_{th1}$ to $A_{th4}$ such that the difference $Y_{err}$ and the difference $\Theta_{err}$ each fall within an allowable range. In particular, the control unit 25 may obtain the parameters $A_{th1}$ and $A_{th4}$ such that the difference $Y_{err}$ and the difference $\theta_{err}$ are reduced (e.g., are minimized). Accordingly, the control unit 25 can determine the second signal in the Y direction and the second signal in the θ direction such that the amplitude of the vibration of the stage 21 caused by the thrust ripple falls within an allowable range.

$$Y_{ref} = \begin{bmatrix} REF[0] \\ REF[1] \\ \vdots \\ REF[N-1] \end{bmatrix}, \Theta_{ref} = \begin{bmatrix} REF_\theta[0] \\ REF_\theta[1] \\ \vdots \\ REF_\theta[N-1] \end{bmatrix} \qquad (30)$$

$$Y_{err}(A_{th1}, A_{th2}, A_{th3}, A_{th4}) = Y_{ref} - \sum_Y \begin{bmatrix} A_{th1} \\ A_{th2} \\ A_{th3} \\ A_{th4} \\ 1 \end{bmatrix} \qquad (31)$$

$$\Theta_{err}(A_{th1}, A_{th2}, A_{th3}, A_{th4}) = \Theta_{ref} - \sum_\theta \begin{bmatrix} A_{th1} \\ A_{th2} \\ A_{th3} \\ A_{th4} \\ 1 \end{bmatrix}$$

When an optimization problem is to be solved for a multivariate function such as equation (31), it is possible to obtain multiple optimum values of the multivariate function by using a weighted evaluation function. For example, equation (32) is given as an example of a weighted evaluation function. Using the unit system of the differences $Y_{err}$ and $\Theta_{err}$, the control unit 25 performs weighting using $q_Y$ and $g_\theta$, such that the evaluation values of the data string Y and the data string Θ are equal. Accordingly, the control unit 25 can determine the second signal in the Y direction and the second signal in the θ direction such that the amplitude of the vibration of the stage 21 caused by the thrust ripple is minimized. Here, the above-described calculation example is an example, and the definitions of the evaluation functions and methods for solving the optimization problem are not limited to the above-described methods.

$$J = q_Y^2 \|Y_{err}(A_{th1}, A_{th2}, A_{th3}, A_{th4})\|^2 + q_\theta^2 \|\Theta_{err}(A_{th1}, A_{th2}, A_{th3}, A_{th4})\|^2 \qquad (32)$$

Embodiment of Lithography Apparatus

An example in which the above-described stage apparatus is applied to a lithography apparatus that forms a pattern on a substrate will be described below. For example, the lithography apparatus can include an exposure apparatus that exposes a substrate to light so as to transfer a pattern on a mask onto the substrate, an imprint apparatus that molds an imprint material on a substrate using a mold, and a rendering apparatus that forms a pattern on the substrate by emitting a charged particle beam to the substrate. In the exposure apparatus, the above-described stage apparatus can be used to control the position of a stage that holds at least one of the mask and the substrate. In the imprint apparatus, the above-described stage apparatus can be used to control the position of a stage holding at least one of the mold and the substrate. Also, in the rendering apparatus, the above-described stage can be used to control the position of a stage holding the substrate. Hereinafter, an example of using the above-described stage apparatus in the exposure apparatus will be described.

Figure 10:
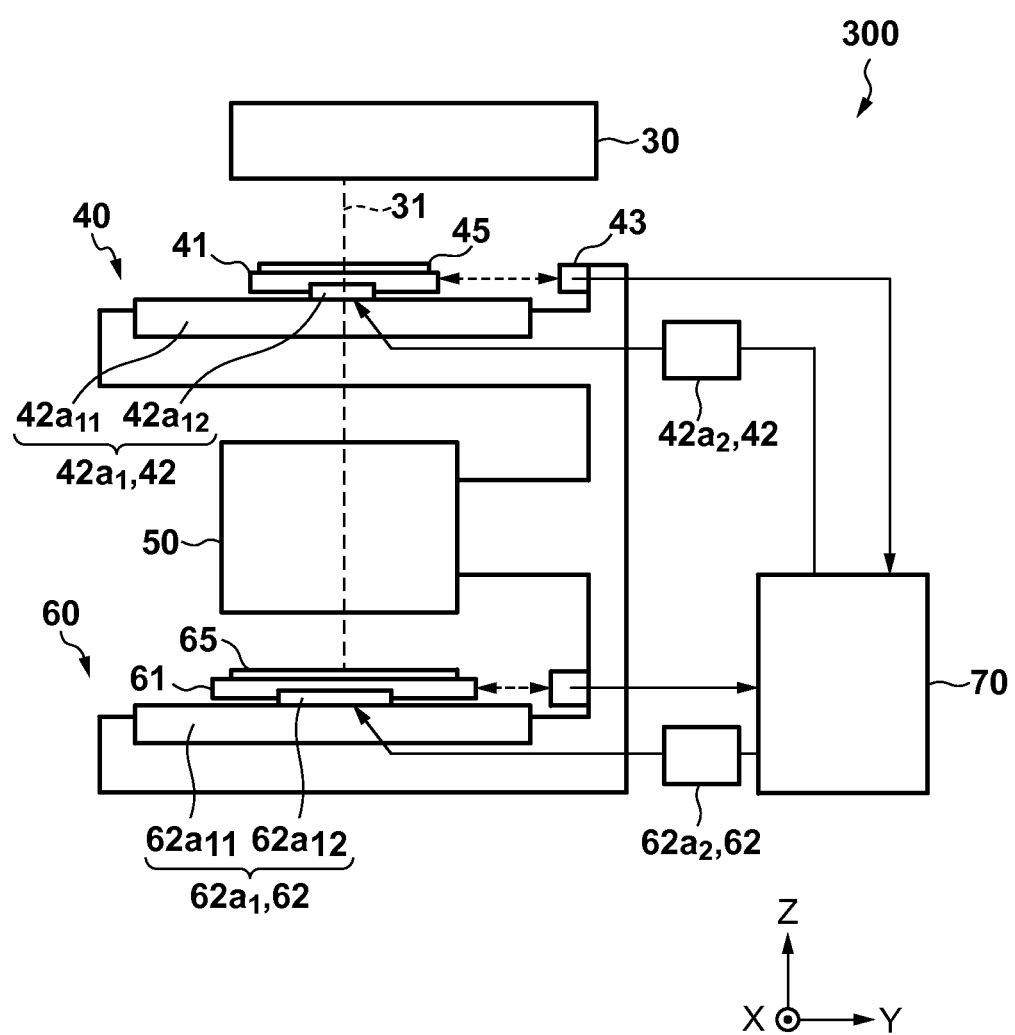
FIG. 10 is a schematic diagram showing an exposure apparatus to which the stage apparatus is applied.

FIG. 10 is a schematic diagram showing an exposure apparatus 300 to which the stage apparatus of the present invention has been applied. The exposure apparatus 300 can include an illumination optical system 30, a projection optical system 50, a first stage apparatus 40 for controlling the position of a mask stage 41 that holds a mask 45, and a second stage apparatus 60 for controlling the position of a substrate stage 61 that holds a substrate 65. Also, the exposure apparatus 300 can include a control unit 70 that controls the units of the exposure apparatus 300. Here, the first stage apparatus 40 and the second stage apparatus 60 are similar in configuration to the stage apparatus 100 of the first embodiment or the stage apparatus 200 of the second embodiment, and therefore description thereof will be omitted here. Also, the control unit 70 according to the present embodiment can include the control unit in the first stage apparatus 40 and the control unit in the second stage apparatus 60.

The mask 45 and the substrate 65 are held by the mask stage 41 and the substrate stage 61 respectively, and are arranged at positions that are optically almost conjugate via the projection optical system 50 (positions of the object surface and image surface of the projection optical system 50). The projection optical system 50 has a predetermined projection magnification (e.g., a factor of ½), and projects a pattern formed on the mask 45 onto the substrate 65 using exposure light 31 emitted from the illumination optical system 30. At this time, the first stage apparatus 40 and the second stage apparatus 60 cause the mask stage 41 and the substrate stage 61 to move relatively in the Y direction, for example, at a high speed corresponding to the projection magnification of the projection optical system 50. This makes it possible to transfer the pattern formed on the mask 45 onto the substrate 65.

The first stage apparatus 40 can include the mask stage 41 that holds the mask 45 using vacuum bonding or the like, the driving unit 42 that drives the mask stage 41, and the measuring unit 43 that measures the position of the mask stage 41. The driving unit 42 can include a linear motor $42a_1$ having a stator $42a_{11}$ and a movable element $42a_{12}$, and a driver $42a_2$ that supplies current to the linear motor $42a_1$ according to a signal supplied from the control unit 70. Also, the control unit 70 controls the driving unit 42 based on a first signal for reducing the deviation between the current position of the mask stage 41 measured by the measuring unit 43 and the target position, and a second signal for reducing vibration of the mask stage 41 caused by the thrust ripple. Also, the second stage apparatus 60 can include the substrate stage 61 that holds a substrate 65 using vacuum adhesion or the like, a driving unit 62 that drives the substrate stage 61, and a measuring unit 63 that measures the position of the substrate stage 61. The driving unit 62 can include a linear motor $62a_2$ having a stator $62a_{11}$ and a movable element $62a_{12}$, and a driver $62a_2$ that supplies current to the linear motor $62a_1$ according to a signal supplied from the control unit 70. Also, as described above, the control unit 70 controls the driving unit 62 based on a first signal for reducing the deviation between the current position of the substrate stage 61 measured by the measuring unit 63 and the target position, and a second signal for reducing vibration of the substrate stage 61 caused by the thrust ripple.

Figure 11B:
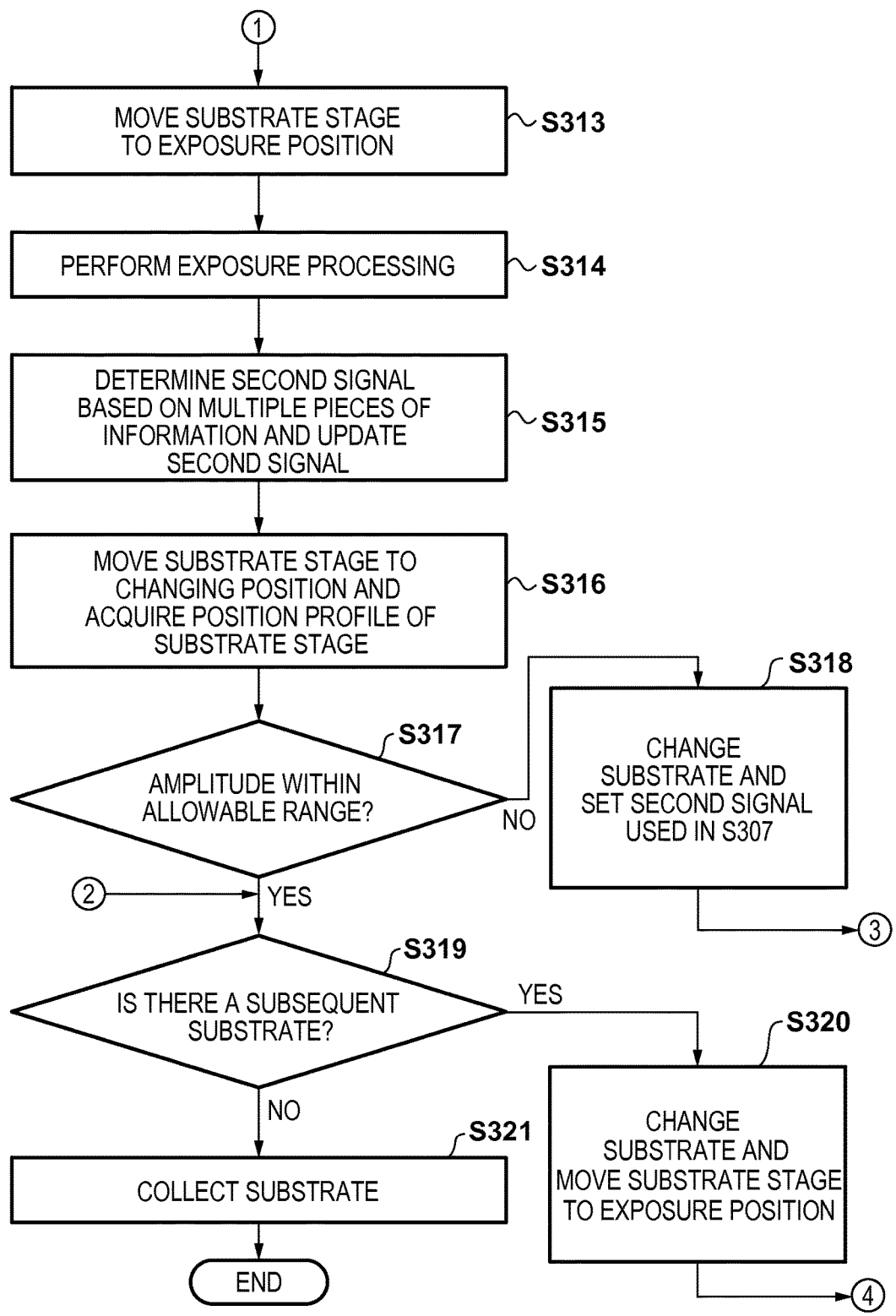

Next, a method for updating the second signal while the exposure apparatus 300 is exposing multiple substrates 65 to light will be described. FIGS. 11A and 11B are flowcharts showing processing in which the exposure apparatus 300 exposes multiple substrates 65 to light. The steps in the flowcharts shown in FIGS. 11A and 11B can be executed by the control unit 70.

In step S301, the control unit 70 controls a substrate conveying unit (not shown) so as to mount the substrate on the substrate stage 61, and moves the substrate stage 61 to a position for performing exposure processing (exposure position). In step S302, the control unit 70 performs exposure processing for transferring the pattern of the mask 45 onto the substrate mounted on the substrate stage 61. In step S303, the control unit 70 moves the substrate stage 61 to a position for changing the substrate mounted on the substrate stage 61 to another substrate (changing position) and obtains the position profile of the substrate stage 61 at that time. In step S304, the control unit 70 determines whether or not the second signal is to be updated. If it is determined that the second signal is to be updated, the procedure moves to step S306, and if it is determined that the second signal is not to be updated, the procedure moves to step S318. Since it is known that the thrust ripple is generated according to the pole pitch of the linear motor, the control unit 70 can obtain the frequency of the thrust ripple based on the movement speed of the substrate stage 61. According to this, the control unit 70 performs frequency analysis on the deviation data for the position of the substrate stage 61, and if the size of the frequency spectrum corresponding to the thrust ripple exceeds a predetermined value, it can be determined that the second signal needs to be updated. In step S305, the control unit 70 controls the substrate conveying unit such that the substrate mounted on the substrate stage 61 is changed to another substrate.

In step S306, the control unit 70 moves the substrate stage 61 to a position for performing exposure processing. In step S307, the control unit 70 performs exposure processing on the substrate mounted on the substrate stage 61. In step S308, the control unit 70 sets the arbitrary signal instead of the second signal. In step S309, the control unit 70 moves the substrate stage 61 to the changing position and obtains information regarding the response of the substrate stage 61 at that time (position profile). In step S310, the control unit 70 controls the substrate conveying unit such that the substrate mounted on the substrate stage 61 is changed to another substrate. In step S311, the control unit 70 once again sets the second signal used in the processing of step S302 (or step S307). In step S312, the control unit 70 determines whether or not the number of acquired pieces of information has reached a predetermined number. If the number of pieces of information has reached the predetermined number, the processing moves to step S313. On the other hand, if the number of pieces of information has not reached the predetermined number, the procedure moves to step S306, the processing of steps S306 and S307 is performed, the values of the parameters for the arbitrary signals (amplitude A and phase α) are subsequently changed in step S308, and the arbitrary signal is set instead of the second signal. Then, in step S309, the control unit 70 moves the substrate stage 61 to the changing position and newly obtains information regarding the response of the substrate stage 61 at that time. In this way, the exposure apparatus 300 of the present embodiment obtains information relating to the response of the substrate stage 61 during multiple exposure processes, and therefore it is possible to suppress a case in which throughput decreases. Also, in step S311, the exposure apparatus 300 of the present embodiment once again sets the second signal used in step S302, and therefore even if multiple pieces of information are obtained, exposure processing can be performed stably.

In step S313, the control unit 70 moves the substrate stage 61 to a position for performing exposure processing. In step S314, the control unit 70 performs exposure processing on the substrate mounted on the substrate stage 61. Similarly to the processing of step S105 in the flowchart shown in FIG. 3, in step S315, the control unit 70 determines the second signal based on the multiple pieces of information and updates the second signal by setting the determined second signal. In step S316, the control unit 70 moves the substrate stage 61 to the changing position and obtains the position profile of the substrate stage 61 at that time.

In step S317, the control unit 70 checks whether or not the amplitude of the vibration of the substrate stage 61 caused by the thrust ripple falls within an allowable range in the position profile of the substrate stage 61 obtained in step S316. If the amplitude does not fall within the allowable range, the procedure moves to step S318, the control unit 70 changes the substrate, once again sets the second signal used in step S302, and thereafter performs the processing of steps S306 to S317 once again. On the other hand, if the amplitude does not fall within the allowable range, the procedure moves to step S319, and the control unit 70 determines whether or not a substrate that is to be subsequently subjected to exposure processing (subsequent substrate) is present. If a subsequent substrate is present, the substrate is changed in step S320, and after the substrate stage 61 is moved to the position for performing exposure processing, the procedure returns to step S302. On the other hand, if no subsequent substrate is present, the substrate is collected in step S321, and the processing ends thereafter. Thus, based on the position profile of the substrate stage 61 obtained among the multiple exposure processes, the exposure apparatus 300 of the present embodiment checks whether or not the second signal determined in step S315 is appropriate, and therefore it is possible to prevent a case in which throughput decreases. Also, in step S318, the exposure apparatus 300 of the present embodiment once again sets the second signal used in step S307, and therefore even if the second signal determined in step S315 is not appropriate, exposure processing can be performed stably.

Embodiment of Method of Manufacturing Article

A method of manufacturing an article according to an embodiment of the present invention is suitable for manufacturing an article, for example, a microdevice such as a semiconductor device or an element having a microstructure. The method of manufacturing an article of the present embodiment includes a step of forming a pattern on a substrate using the above-described lithography apparatus (exposure apparatus) (step of exposing substrate to light), and a step of processing (e.g., developing) the substrate on which the pattern was formed in the previous step. Furthermore, the manufacturing method includes other known steps (oxidation, film formation, vapor deposition, doping, flattening, etching, resist removal, dicing, bonding, packaging, and the like). The method of manufacturing an article of the present embodiment is advantageous in at least one of the performance, quality, productivity, and production cost of the article, as compared with conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-124684 filed on Jun. 17, 2014, which is hereby incorporated by reference herein in its entirety.

What is claimed is:

1. A stage apparatus including a stage configured to be movable, the apparatus comprising:
   a driving unit configured to drive the stage by providing thrust to the stage;
   a measuring unit configured to measure a position of the stage; and
   a control unit configured to control the position of the stage by supplying, to the driving unit, a first combination signal including a first signal for reducing a deviation between a current position of the stage and a target position, and a second signal for reducing vibration of the stage caused by a thrust ripple included in the thrust,
   wherein the second signal is generated by the control unit by performing a generation process, the generation process including:
      preparing a plurality of third signals, wherein an amplitude, a phase, or both the amplitude and the phase of each of the plurality of third signals is different from each other;
      obtaining, as information relating to a response of the stage, a measurement result of the measuring unit when driving the stage by supplying a second combination signal including the first signal and one of the plurality of third signals to the driving unit, wherein the information is obtained with respect to each of the plurality of third signals; and
      determining the second signal based on the information obtained with respect to each of the plurality of third signals, such that the vibration of the stage caused by the thrust ripple falls within an allowable range.

2. The stage apparatus according to claim 1, wherein the second combination signal includes a signal to move the stage at a constant speed.

3. The stage apparatus according to claim 1, wherein the second combination signal includes a signal to move the stage at a constant speed, and the information is obtained when the vibration of the stage is constant.

4. The stage apparatus according to claim 1, wherein, in the generation process,
   the control unit determines, based on the information obtained with respect to each of the plurality of third signals, a function whose input is the second signal and whose output is the position of the stage, and
   the control unit determines the second signal such that the amplitude of the vibration of the stage obtained using the function falls within an allowable range.

5. The stage apparatus according to claim 4, wherein, in the generation process, the control unit determines the second signal such that the vibration of the stage obtained using the function is lower than the vibration of the stage obtained without using the function.

6. The stage apparatus according to claim 1, wherein
   the control unit determines the second signal by determining an amplitude and a phase of the second signal such that the vibration of the stage caused by the thrust ripple falls within an allowable range.

7. The stage apparatus according to claim 1, wherein, in the generation process, the control unit prepares a plurality of arbitrary signals as the plurality of third signals.

8. The stage apparatus according to claim 1, wherein, in the generation process, the control unit prepares the plurality of third signals such that the vibration of the stage when driving the stage by supplying the second combination signal to the driving unit is 2 to 5 times larger than the vibration of the stage caused by the thrust ripple.

9. A lithography apparatus which forms a pattern on a substrate, the lithography apparatus comprising:
   the stage apparatus which includes a stage configured to be movable,
   wherein the stage apparatus includes:
      a driving unit configured to drive the stage by providing thrust to the stage;
      a measuring unit configured to measure a position of the stage; and
      a control unit configured to control the position of the stage by supplying, to the driving unit, a first combination signal including a first signal for reducing a deviation between a current position of the stage and a target position, and a second signal for reducing vibration of the stage caused by a thrust ripple included in the thrust, and
   wherein the second signal is generated by the control unit by performing a generation process, the generation process including:
      preparing a plurality of third signals, wherein an amplitude, a phase, or both the amplitude and the phase of each of the plurality of third signals is different from each other;
      obtaining, as information relating to a response of the stage, a measurement result of the measuring unit when driving the stage by supplying a second combination signal including the first signal and one of the plurality of third signals to the driving unit, wherein the information is obtained with respect to each of the plurality of third signals; and
      determining the second signal based on the information obtained with respect to each of the plurality of third signals, such that the vibration of the stage caused by the thrust ripple falls within an allowable range.

10. The lithography apparatus according to claim 9, wherein the control unit obtains the information while the stage is moved in periods between a plurality of processes for forming a pattern on each of a plurality of substrates wherein supplying the first combination signal to the driving unit.

11. A method of manufacturing an article, the method comprising the steps of:
    forming a pattern on a substrate using a lithography apparatus; and
    processing the substrate, on which the pattern has been formed, to manufacture the article,
    wherein the lithography apparatus forms the pattern on the substrate and includes a stage apparatus, and
    wherein the stage apparatus includes:
        a stage configured to be movable;
        a driving unit configured to drive the stage by providing thrust to the stage;
        a measuring unit configured to measure a position of the stage; and
        a control unit configured to control the position of the stage by supplying, to the driving unit, a first combination signal including a first signal for reducing a deviation between a current position of the stage and a target position, and a second signal for reducing vibration of the stage caused by a thrust ripple included in the thrust,
    wherein the second signal is generated by the control unit by performed a generation process, the generation process including:
        preparing a plurality of third signals, wherein an amplitude, a phase, or both the amplitude and the phase of each of the plurality of third signals is different from each other;
        obtaining, as information relating to a response of the stage, a measurement result of the measuring unit when driving the stage by supplying a second combination signal including the first signal and one of the plurality of third signals to the driving unit, wherein the information is obtained with respect to each of the plurality of third signals; and
        determining the second signal based on the information obtained with respect to each of the plurality of third signals, such that the vibration of the stage caused by the thrust ripple falls within an allowable range.

12. A determination method of determining a second signal in a stage apparatus including a stage configured to be movable, a measuring unit configured to measure a position of the stage, and a driving unit configured to drive the stage by providing thrust to the stage, the stage apparatus being configured to control the position of the stage by supplying, to the driving unit, a first combination signal including a first signal for reducing a deviation between a current position of the stage and a target position, and a second signal for reducing vibration of the stage caused by a thrust ripple included in the thrust, the determination method comprising:
    preparing a plurality of third signals, wherein an amplitude, a phase, or both the amplitude and the phase of each of the plurality of third signals is different from each other;
    obtaining, as information relating to a response of the stage, a measurement result of the measuring unit when driving the stage by supplying a second combination signal including the first signal and one of the plurality of third signals to the driving unit, wherein the information is obtained with respect to each of the plurality of third signals; and
    determining the second signal based on the information obtained with respect to each of the plurality of third signals, such that the vibration of the stage caused by the thrust ripple falls within an allowable range.

* * * * *